(12) United States Patent
Liu et al.

(10) Patent No.: US 11,873,409 B2
(45) Date of Patent: Jan. 16, 2024

(54) PRINTABLE MOLECULAR INK

(71) Applicant: National Research Council of Canada, Ottawa (CA)

(72) Inventors: Xiangyang Liu, Ottawa (CA); Chantal Paquet, Ottawa (CA); Arnold J. Kell, Ottawa (CA); Patrick Roland Lucien Malenfant, Ottawa (CA)

(*) Notice: Subject to any disclaimer, the term of this patent is extended or adjusted under 35 U.S.C. 154(b) by 331 days.

(21) Appl. No.: 16/483,842

(22) PCT Filed: Feb. 8, 2018

(86) PCT No.: PCT/IB2018/050788
§ 371 (c)(1),
(2) Date: Aug. 6, 2019

(87) PCT Pub. No.: WO2018/146616
PCT Pub. Date: Aug. 16, 2018

(65) Prior Publication Data
US 2020/0017697 A1  Jan. 16, 2020

Related U.S. Application Data

(60) Provisional application No. 62/456,272, filed on Feb. 8, 2017.

(51) Int. Cl.
*C09D 11/037* (2014.01)
*B41F 15/02* (2006.01)
(Continued)

(52) U.S. Cl.
CPC ............ *C09D 11/037* (2013.01); *B41F 15/02* (2013.01); *C09D 11/03* (2013.01); *C09D 11/033* (2013.01);
(Continued)

(58) Field of Classification Search
CPC .................................................. C09D 11/037
See application file for complete search history.

(56) References Cited

U.S. PATENT DOCUMENTS

| 3,228,897 A | 1/1966 | Nellessen et al. |
| 3,702,259 A | 11/1972 | Nielsen |

(Continued)

FOREIGN PATENT DOCUMENTS

| CA | 2017808 A1 | 12/1990 |
| CN | 101010388 A | 8/2007 |

(Continued)

OTHER PUBLICATIONS

Stay D, et al. Macromolecules. 2013, 46, 4361-4369.
(Continued)

*Primary Examiner* — William D Young
(74) *Attorney, Agent, or Firm* — BRUNET & CO., LTD.; Hans Koenig; Robert Brunet

(57) ABSTRACT

A molecular ink contains a silver carboxylate, an organic amine compound, an organic polymer binder, a surface tension modifier, and a solvent. The ink may be used to produce conductive silver traces on a substrate for use in fabricating electronic devices. The ink is particularly useful for producing conductive silver traces on a shapeable (e.g. stretchable) substrate in a low temperature sintering process. Also, a process for producing a conductive silver trace on a shaped substrate involves depositing the molecular ink on a shapeable substrate, drying the ink on the shapeable substrate to form a non-conductive trace containing the silver carboxylate on the shapeable substrate, forming the shapeable substrate into a shape to produce a shaped substrate so that at least a portion of the non-conductive trace is situated on a shaped portion of the shaped substrate, and sintering the shaped substrate to decompose the silver carboxylate to metallic silver thereby producing a conductive silver trace (Continued)

on at least the shaped portion of the shaped substrate. The process reduces potential for cracking of conductive silver traces on shaped substrates.

13 Claims, 8 Drawing Sheets

(51) Int. Cl.
C09D 11/03 (2014.01)
C09D 11/033 (2014.01)
C09D 11/52 (2014.01)
D02G 3/12 (2006.01)
D02G 3/36 (2006.01)
D02G 3/44 (2006.01)
H05K 1/02 (2006.01)
H05K 1/09 (2006.01)
H05K 3/12 (2006.01)
C08K 5/098 (2006.01)
C08K 5/17 (2006.01)

(52) U.S. Cl.
CPC .............. *C09D 11/52* (2013.01); *D02G 3/12* (2013.01); *D02G 3/36* (2013.01); *D02G 3/441* (2013.01); *H05K 1/0283* (2013.01); *H05K 1/095* (2013.01); *H05K 3/1216* (2013.01); *H05K 3/1283* (2013.01); *C08K 5/098* (2013.01); *C08K 5/17* (2013.01); *C08K 2201/001* (2013.01); *H05K 2203/1105* (2013.01); *H05K 2203/1131* (2013.01)

(56) References Cited

U.S. PATENT DOCUMENTS

| | | | |
|---|---|---|---|
| 3,729,339 A | 4/1973 | Kiel | |
| 3,989,644 A | 11/1976 | Bolon et al. | |
| 4,088,801 A | 5/1978 | Bolon et al. | |
| 4,099,376 A | 7/1978 | Japs | |
| 4,180,407 A * | 12/1979 | Gibson | C09D 11/16 106/31.64 |
| 4,248,921 A | 2/1981 | Steigerwald et al. | |
| 4,396,666 A | 8/1983 | Ernsberger | |
| 4,487,811 A | 12/1984 | Eichelberger et al. | |
| 4,552,690 A | 11/1985 | Nobuyuki et al. | |
| 4,687,597 A | 8/1987 | Siuta | |
| 4,775,594 A | 10/1988 | Desjarlais | |
| 4,857,111 A | 8/1989 | Haubennestel et al. | |
| 5,045,236 A | 9/1991 | Tsunaga et al. | |
| 5,248,451 A | 9/1993 | Tsunaga et al. | |
| 5,306,590 A | 4/1994 | Felder | |
| 5,900,327 A | 5/1999 | Pei et al. | |
| 5,960,251 A | 9/1999 | Brusic et al. | |
| 5,980,622 A | 11/1999 | Byers | |
| 5,989,700 A | 11/1999 | Krivopal | |
| 6,036,889 A | 3/2000 | Kydd | |
| 6,048,389 A | 4/2000 | Price et al. | |
| 6,090,890 A | 7/2000 | Murakami et al. | |
| 6,521,032 B1 | 2/2003 | Lehmann et al. | |
| 6,663,799 B2 | 12/2003 | Kokubo et al. | |
| 6,770,122 B2 | 8/2004 | Thompson | |
| 7,141,104 B2 | 11/2006 | De Voeght et al. | |
| 7,211,205 B2 | 5/2007 | Conaghan et al. | |
| 7,473,307 B2 | 1/2009 | Song et al. | |
| 7,566,357 B2 | 7/2009 | Zhao | |
| 7,629,017 B2 | 12/2009 | Kodas et al. | |
| 7,731,812 B2 | 6/2010 | Wang et al. | |
| 7,960,037 B2 | 6/2011 | Liu et al. | |
| 8,043,535 B2 | 10/2011 | Kamikoriyama et al. | |
| 8,262,894 B2 | 9/2012 | Xu et al. | |
| 8,282,860 B2 | 10/2012 | Chung et al. | |
| 8,339,040 B2 | 12/2012 | Bruton et al. | |
| 8,597,397 B2 | 12/2013 | Kunze et al. | |
| 8,945,328 B2 | 2/2015 | Longinotti-Buitoni et al. | |
| 8,948,839 B1 | 2/2015 | Longinotti-Buitoni et al. | |
| 9,028,599 B2 | 5/2015 | Abe | |
| 9,145,503 B2 | 9/2015 | Yu et al. | |
| 9,187,657 B2 | 11/2015 | Yano et al. | |
| 9,198,288 B2 | 11/2015 | Wu et al. | |
| 9,283,618 B2 | 3/2016 | Wu et al. | |
| 9,460,824 B2 | 10/2016 | Liu et al. | |
| 10,999,933 B2 * | 5/2021 | Wei | C09D 11/52 |
| 2003/0180451 A1 * | 9/2003 | Kodas | H05K 3/105 427/123 |
| 2005/0070629 A1 | 3/2005 | Roberts | |
| 2005/0287472 A1 * | 12/2005 | Lee | H01J 11/22 430/270.1 |
| 2006/0118768 A1 | 6/2006 | Liu et al. | |
| 2007/0078215 A1 | 4/2007 | Yoon et al. | |
| 2007/0125989 A1 | 6/2007 | Kodas et al. | |
| 2007/0154644 A1 | 7/2007 | Hwang et al. | |
| 2008/0093422 A1 | 4/2008 | Kodas et al. | |
| 2008/0108218 A1 | 5/2008 | Kodas et al. | |
| 2008/0178761 A1 | 7/2008 | Tomotake et al. | |
| 2009/0267060 A1 | 10/2009 | Forrest et al. | |
| 2010/0084599 A1 * | 4/2010 | Lewis | C09D 17/006 252/62.2 |
| 2011/0111138 A1 | 5/2011 | McCullough et al. | |
| 2012/0104330 A1 | 5/2012 | Choi et al. | |
| 2013/0121872 A1 | 5/2013 | Matsumoto | |
| 2013/0156971 A1 | 6/2013 | McCullough et al. | |
| 2013/0161573 A1 | 6/2013 | Torardi et al. | |
| 2013/0264104 A1 | 10/2013 | Su et al. | |
| 2013/0277096 A1 | 10/2013 | Seong et al. | |
| 2014/0124713 A1 | 5/2014 | Majumdar et al. | |
| 2014/0178601 A1 | 6/2014 | Wei et al. | |
| 2014/0034901 A1 | 11/2014 | Abe | |
| 2014/0349017 A1 | 11/2014 | Abe | |
| 2014/0349025 A1 | 11/2014 | Hui et al. | |
| 2015/0004325 A1 | 1/2015 | Walker et al. | |
| 2015/0056426 A1 | 2/2015 | Grouchko et al. | |
| 2015/0132476 A1 | 5/2015 | Wu et al. | |
| 2015/0257279 A1 | 9/2015 | Shahbazi et al. | |
| 2015/0298248 A1 | 10/2015 | Walker et al. | |
| 2015/0299489 A1 | 10/2015 | Walker | |
| 2016/0081189 A1 | 3/2016 | Shimoda et al. | |
| 2016/0095547 A1 | 4/2016 | Wang et al. | |

FOREIGN PATENT DOCUMENTS

| | | |
|---|---|---|
| CN | 101271929 A | 9/2008 |
| CN | 101519356 A | 9/2009 |
| CN | 102270514 A | 12/2011 |
| CN | 102618033 A | 8/2012 |
| CN | 102863845 A | 1/2013 |
| CN | 103084581 A | 5/2013 |
| CN | 103380466 A | 10/2013 |
| CN | 104263082 A | 1/2015 |
| CN | 105504998 A | 4/2016 |
| CN | 106147405 A | 11/2016 |
| EP | 0335237 A2 | 10/1989 |
| EP | 2871260 A1 | 5/2015 |
| GB | 1443099 A | 7/1976 |
| JP | S61136978 A | 6/1986 |
| JP | 63278983 A | 11/1988 |
| JP | H10279868 A | 10/1998 |
| JP | 2000136333 A | 5/2000 |
| JP | 2004162110 A | 6/2004 |
| JP | 2005537386 A | 12/2005 |
| JP | 2009212182 A | 9/2009 |
| JP | 2009256218 A | 11/2009 |
| JP | 20100018696 A | 1/2010 |
| JP | 2012234803 A | 11/2012 |
| JP | 2013-028115 A | 2/2013 |
| JP | 2013527877 A | 7/2013 |
| JP | 2014148732 A | 8/2014 |
| JP | 2014182913 A | 9/2014 |
| JP | 5848438 B2 | 1/2016 |
| KR | 20120132424 A | 12/2012 |
| KR | 101350507 A | 1/2014 |
| KR | 20150045605 A | 4/2015 |
| KR | 20150077676 A | 7/2015 |

(56) References Cited

FOREIGN PATENT DOCUMENTS

| | | | |
|---|---|---|---|
| KR | 20150082133 A | 7/2015 | |
| TW | 200416261 A | 9/2004 | |
| TW | 201627422 A | 8/2016 | |
| WO | 03/032084 A2 | 4/2003 | |
| WO | 2003/095701 A1 | 11/2003 | |
| WO | 2006/093398 A1 | 9/2006 | |
| WO | 2009/036921 A1 | 3/2009 | |
| WO | 2009/126918 A1 | 10/2009 | |
| WO | 2010/036397 A2 | 4/2010 | |
| WO | 2010/128107 A1 | 11/2010 | |
| WO | 2012/135551 A1 | 10/2012 | |
| WO | 2013/036519 A1 | 3/2013 | |
| WO | 2013/073331 A1 | 5/2013 | |
| WO | 2013/073349 A1 | 5/2013 | |
| WO | 2013/096664 A1 | 6/2013 | |
| WO | 2013/128449 A2 | 9/2013 | |
| WO | 2015/024115 A1 | 2/2015 | |
| WO | 2015/160938 A1 | 10/2015 | |
| WO | 2015/183679 A1 | 12/2015 | |
| WO | 2015/192248 A1 | 12/2015 | |
| WO | 2016/012753 A1 | 1/2016 | |
| WO | 2017/103797 A1 | 6/2017 | |

OTHER PUBLICATIONS

Suren, S., et al. Thin Solid Films. 2016, 607, 36-42.
Szeremeta J, et al. Optical Materials. 2011, 33, 1372-1376.
Tsai C-Y, et al. Nanoscale Research Letters. 2015, 10, 357 (7 pages).
Vaseem M, et al. ACS Appl. Mater. Interfaces. 2016, 8, 177-186.
Walker SB, et al. J. Am. Chem.Soc. 2012, 134, 1419-1421.
Wang H, et al. small. 2015, 11(1), 126-133.
Yabuki A, et al. Thin Solid Films. 2011, 519, 6530-6533.
Yabuki A, et al. Materials Research Bulletin. 2012, 47, 4107-4111.
Yabuki A, et al. Synthesis of copper conductive film by low-temperature thermal decomposition of coppereaminediol complexes under an air atmosphere. Materials Chemistry and Physics. 2014, http://dx.doi.org/10.1016/j.matchemphys.2014.07.047, 1e6.
Yim C, et al. ACS Appl. Mater. Interfaces. 2016, 8, 22369-22373.
Yong Y, et al. Scientific Reports. 7, 45150, DOI: 10.1038/srep45150, 9 pages.
Zhai D, et al. Colloids and Surfaces A: Physicochem. Eng. Aspects. 2013, 424, 1-9.
Zhu X, et al. Langmuir. 2012, 28, 14461-14469.
Stranks SD, et al. Adv. Mater. 2013, 25, 4365-4371.
First Examination Report dated Mar. 30, 2021 on Indian application 201927032111.
Office action dated Dec. 2, 2021 on Japanese application 2019-563708.
Araki T, et al. Langmuir. 2013, 29, 11192-11197.
Bjornholm, T et al. J. Am. Chem. Soc. 1998, 120, 7643-7644.
Chen W, et al. Journal of Electronic Materials. 2015, 44(7), 2479-2487.
Choi T-H, et al. Journal of Materials Chemistry. 2012, 22, 3624.
Chung W-H, et al. Thin Solid Films. 2015, 580, 61-70.
Curtis C, et al. NCPV Program Review Meeting Conference Paper (Lakewood Colorado). Metallizations by Direct-Write Inkjet Printing. NREL/CP-520-31020, 2001, 6 pages.
Dang Z-M, et al. Journal of Applied Polymer Science. 2012, 126, 815-821.
Dearden AL, et a. Macromol. Rapid Commun. 2005, 26, 315-318.
De Boer B, et al. Macromolecules. 2002, 35, 6883-6892.
Deore B, et al. Conference Poster. New Conductors for Advanced User Interfaces, Circuits and Devices. Canadian Society for Chemistry. 2015.
Ding J, et al. Nanoscale. 2014, 6, 2328-2339.
Dong Y, et al. Thin Solid Films. 2015, 589, 381-387.
Farraj Y, et al. Chem. Commun., 2015, 51, 1587-1590.
Gu L, et al. Applied Mechanics and Materials Online. 2013, 469, 51-54.
Henkel's Printed Electronic Inks. Product Brochure F_LR615251. 2015.
Hokita Y, et al. ACS Appl. Mater. Interfaces. 2015, 7, 19382-19389.
Hlu Y, et al. 15th International Conference on Electronic Packaging Technology. 2014, 1565-1567.
Hwang J, et al. Bull. Korean Chem. Soc. 2014, 35(1), 147-150.
International Preliminary Report on Patentability for PCT/IB2018/050788 dated Jul. 24, 2018.
International Preliminary Report on Patentability for PCT/IB2018/050789 dated Jul. 23, 2018.
International Preliminary Report on Patentability for PCT/IB2018/050790 dated Jul. 17, 2018.
International Preliminary Report on Patentability for PCT/IB2018/050791 dated Jul. 25, 2018.
International Search Report for PCT/IB2018/050788 dated Jul. 24, 2018.
International Search Report for PCT/IB2018/050789 dated Jul. 23, 2018.
International Search Report for PCT/IB2018/050790 dated Jul. 17, 2018.
International Search Report for PCT/IB2018/050791 dated Jul. 25, 2018.
Jahn SF, et al. Thin Solid Films. 2010, 518, 3218-3222.
Kamyshny A, et al. The Open Applied Physics Journal. 2011, 4, 19-36.
Kawaguchi Y, et al. Journal of Coating Science and Technology. 2016, 3(2), 56-61.
Kim SJ, et al. Thin Solid Films. 2012, 520, 2731-2734.
Kim I, et al. RSC Advances. 2013, 3, 15169-15177 (with ESI).
Lee B, et al. Current Applied Physics. 2009, 9, e157-e160.
Li Y, et al. J Mater Sci: Mater Electron. 2016, 27, 11432-11438.
Li W, et al. J. Mater. Chem. C. 2016, 4, 8802-8808.
Lin H-C, et al. Microelectronic Engineering. 2009, 86, 2316-2319.
Lyons AM, et al. Abstract of J. Phys. Chem. 1991, 95(3), 1098-1105.
Malenfant PRL, et al. NRC Printable Electronics. Presentation at IDTechEx (Santa Clara 2013).
Nie X, et al. Applied Surface Science. 2012, 261, 554-560.
Pacioni NL, et al. Silver Nanoparticle Applications, Engineering Materials. (Springer International Publishing Switzerland 2015, E.I. Alarcon et al. (eds.), DOI 10.1007/978-3-319-11262-6_2) pp. 13-46.
Paquet C, et al. New Conductors for Advanced User Interfaces, Circuits and Devices. Poster Presentation at CPEIA 2015.
Park K-H, et al. J. Am. Chem. Soc. 2005, 127(26), 9330-9331.
Pham LQ, et al. Journal of Colloid and Interface Science. 2012, 365, 103-109.
Polzinger B, et al. 2011 11th IEEE International Conference on Nanotechnology. (Portland Marriott. Aug. 15-18, 2011, Portland, Oregon, USA.) pp. 201-204.
Rajan K, et al. Nanotechnology, Science and Applications. 2016, 9, 1-13.
Rao RVK, et al. RSC Adv. 2015, 5, 77760-77790.
Sakamoto M, et al. Journal of Photochemistry and Photobiology C: Photochemistry Reviews. 2009, 10, 33-56.
Schulz DL, et al. Electrochemical and Solid-State Letters. 2001, 4(8), C58-C61.
Shen L, et al. Journal of Electronic Materials. 2015, 44(2), 720-724.
Shin D-Y, et al. J. Mater. Chem. 2012, 22, 11755-11764.
Shin D-H, et al. ACS Appl. Mater. Interfaces. 2014, 6, 3312-3319.
European Search Report dated Nov. 9, 2020 on European application 18751731.3.
Office action and search report dated Sep. 10, 2021 on Chinese application 2018800160651.
Office action and search report dated Oct. 14, 2021 on Taiwan application 107104324.
Office action dated Mar. 16, 2022 on European application 18751731.3.
Office action and search report dated Apr. 19, 2022 on Chinese application 2018800160651.
Office action dated Aug. 17, 2022 on Korean application 10-2019-7026313.
Office action dated Sep. 28, 2022 on Chinese application 201880016065.1.
Office action dated Nov. 30, 2022 on Taiwan application 107104324.

(56) References Cited

OTHER PUBLICATIONS

Office action dated Feb. 27, 2023 on Chinese application 2018800160651.
Office action dated Feb. 24, 2023 on Korean application 10-2019-7026313.
Office action dated Jul. 24, 2023 on Korean application 10-2019-7026313.
Office action dated Jul. 21, 2022 on Japanese application 2019-563708.

* cited by examiner

PRINTABLE MOLECULAR INK

CROSS-REFERENCE TO RELATED APPLICATIONS

This application is a National Entry of International Application PCT/IB2018/050788 filed Feb. 8, 2018, and claims the benefit of United States Provisional Application U.S. Ser. No. 62/456,272 filed Feb. 8, 2017.

FIELD

This application relates to inks, particularly to inks that can be sintered at relatively low temperature and/or can enable the production of conductive traces on a shapeable substrate, for example a stretchable substrate.

BACKGROUND

Screen printing is the most commonly used technique to produce conductive features on flexible substrates and the most common ink employed in the printed electronics industry is metal flake-based inks. Flake-based inks produce thick traces (>10 µm) and the resulting linewidths of the traces are typically >100 µm. The temperature required to produce conductive traces is usually over 120° C., though recently two commercially available silver flake-based inks have been developed that can be sintered at a temperature as low as 60° C. with sheet resistivity values of 20-25 and 50-60 mΩ/□/mil, respectively. There is also increasing interest in developing inks that can be thermoformed or stretched and remain conductive. However, thermoforming flake-based conductive inks can lead to increases in trace resistance (up to 10-fold) or lead to cracked and nonconductive traces. With respect to stretchable conductive inks, linear traces typically cannot be stretched beyond 20% without breaking and have to be printed in a meandering pattern if more stretch is required. All of the inks described thus far utilize silver flakes as the conductive component, but there is increasing interest in using silver precursor inks (i.e. silver molecular inks) in printing technologies because they can potentially enable the development of very thin, narrow and mechanically robust traces.

It is known that silver formate-alkylamine complexes can be converted to silver traces at temperatures as low as 25-80° C. Inkjet and spray based formulations comprised of such salts have demonstrated the ability to produce sub 100 µm traces, but silver formate is only stable when mixed with specific concentrations of amines (i.e. ammonia, alkylamines etc.) and decomposes at room temperature in the absence of amines. As such, inks derived from silver formate salts are not very compatible with screen, gravure and flexographic printing, where the inks are spread out over large surface areas and susceptible to evaporation of water and volatile amines which will lead to conversion to silver on the screen or anilox/transfer rollers. In addition, the presence of ammonia makes it incompatible with printing in an open manufacturing environment. It would be beneficial to develop an ink that is stable at room temperature and does not contain a noxious gas such as ammonia and volatile solvents so that the ink could be printed via more industry relevant methods such as screen, gravure and flexographic printing.

One option is the use of silver oxalate salts mixed with alkylamines, in part because silver oxalate is much more stable at room temperature and does not begin to thermally decompose until temperatures above 100° C. However, mixtures of silver oxalate and alkylamines have been shown to produce poorly conductive dip coated films following sintering at 120-130° C. The resulting films can become significantly more conductive following photonic sintering. Other examples demonstrate that inkjet-printed silver oxalate salt/alkylamine mixtures can produce traces with volume resistivity values of about 350 µΩ·cm after sintering for 5 minutes at 130° C., and the values can decrease to 25-50 µΩ·cm when sintered for extended periods of time (30-60 minutes). In addition, increasing the sintering temperature to 170° C. also serves to reduce the volume resistivity (8-9 µΩ·cm). However, temperatures greater than 140° C. are incompatible with low temperature substrates such as polyethylene terephthalate (PET), polycarbonate (PC), acrylonitrile/butadiene/styrene (ABS), thermoplastic polyurethane (TPU) and many textiles.

The development of inks that are compatible with such low temperature substrates can lead into thermoforming and stretchable conductor applications which are typically carried out on substrates with low glass transition temperatures. Though several flake-based silver inks have been specially formulated to withstand thermoforming/stretching and remain conductive, such inks are susceptible to cracking at elongations greater than 10-20% resulting in significant resistance increases, particularly for traces under 500 µm wide.

Recently a molecular silver ink platform has been developed that can be formulated for screen printing (International Patent Publication WO 2015/192248 published Dec. 23, 2015). This screen printable molecular ink has excellent printability and can be processed with either heat or pulsed light to produce traces with high conductivity, robust mechanical properties and linewidths as narrow as 76 µm separated by 36 µm. A valuable feature of such molecular inks is that they can be printed, dried and subsequently sintered (using either heat or pulsed light) in order to convert the nonconductive molecular precursors into conductive metal traces.

However, there remains a need to develop printable inks which form conductive traces at relatively low temperatures, especially on low temperature thermoformable, stretchable and textile-based substrates and threads/yarns. The use of molecular inks in thermoforming applications is particularly beneficial, enabling the option of screen printing, drying, thermoforming and subsequently photonically sintering the formed traces to make them conductive.

SUMMARY

In one aspect, there is provided a molecular ink comprising: a silver carboxylate; an organic amine compound; an organic polymer binder; a surface tension modifier; and a solvent.

In another aspect, there is provided a process for producing a conductive silver trace on a substrate, the process comprising depositing the molecular ink onto a substrate to form a non-conductive trace of the ink on the substrate, and sintering the non-conductive trace of the ink on the substrate to form the conductive silver trace.

In another aspect, there is provided a process for producing a conductive silver trace on a shaped substrate, the process comprising: depositing the molecular ink on a shapeable substrate; drying the ink on the shapeable substrate to form a non-conductive trace containing the silver carboxylate on the shapeable substrate; forming the shapeable substrate into a shape to produce a shaped substrate so that at least a portion of the non-conductive trace is situated on a shaped portion of the shaped substrate; and sintering (e.g. photosintering) the shaped substrate to decompose the silver carboxylate to metallic silver thereby producing a conductive silver trace on at least the shaped portion of the shaped substrate.

In another aspect, there is provided a process for producing a conductive silver trace on a shaped substrate, the process comprising: depositing the molecular ink on a shapeable substrate; drying and sintering the ink on the shapeable substrate to form a conductive trace containing silver metal; forming the shapeable substrate into a shape to produce a shaped substrate so that at least a portion of the conductive trace is situated on a shaped portion of the shaped substrate thereby producing a conductive silver trace on at least the shaped portion of the shaped substrate.

In another aspect, there is provided a process for producing a conductive silver trace on a stretchable substrate, the process comprising: depositing the molecular ink on a stretchable substrate; drying and sintering the ink on the stretchable substrate to form a conductive trace containing silver metal.

In another aspect, there is provided a process for producing a conductive silver thread/yarn, the process comprising: soaking the thread/yarn in the molecular ink, removing excess ink, and thermally sintering the coated thread/yarn to form a conductive thread/yarn.

In another aspect, there is provided a substrate comprising a conductive silver trace produced by a process as described above.

In another aspect, there is provided a process for producing a conductive silver yarn or thread, the process comprising depositing the molecular ink onto a yarn or thread to form a non-conductive yarn or thread, and sintering the non-conductive yarn/thread to form the conductive silver thread/yarn.

In another aspect, there is provided an electronic device comprising a substrate having a conductive silver trace produced by a process as described above.

In another aspect, there is provided an electronic device or garment comprising a thread/yarn coated with a conductive silver coating or layer produced by a process as described above.

Further features will be described or will become apparent in the course of the following detailed description. It should be understood that each feature described herein may be utilized in any combination with any one or more of the other described features, and that each feature does not necessarily rely on the presence of another feature except where evident to one of skill in the art.

BRIEF DESCRIPTION OF THE DRAWINGS

For clearer understanding, preferred embodiments will now be described in detail by way of example, with reference to the accompanying drawings, in which.

DETAILED DESCRIPTION

Figure 1A:
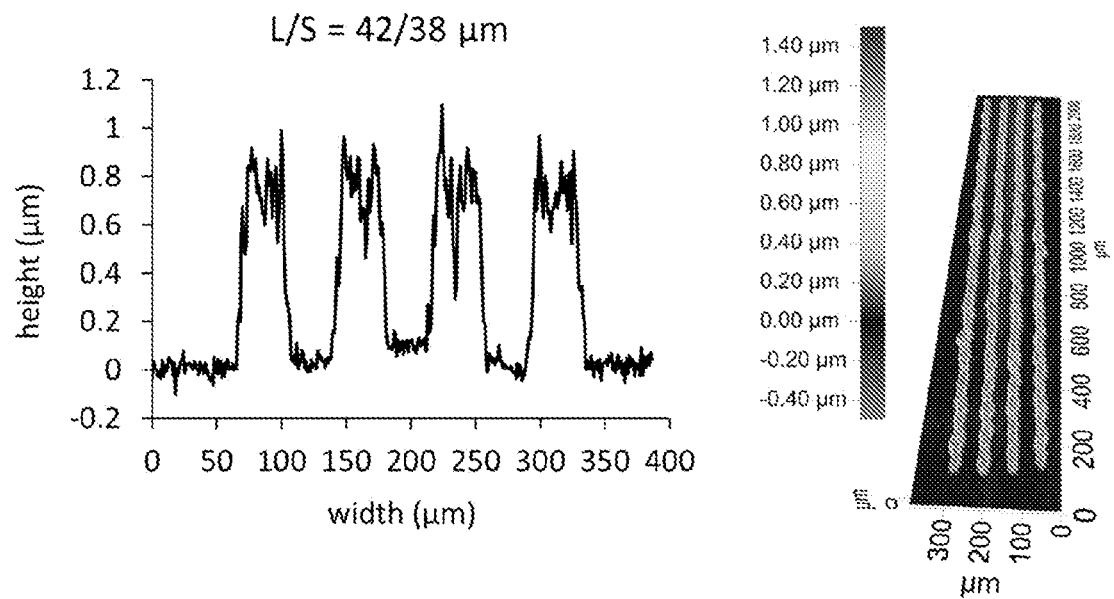
FIG. 1A depicts a three dimensional profilometer image of printed and sintered traces produced from a low temperature molecular ink of the present invention (NRC-848A3a), and a resulting cross section that highlights linewidth and line spacing (L/S) that can be achieved with the ink.

Silver carboxylates are preferably organic silver salts comprising a silver ion and an organic group containing a carboxylic acid moiety. The carboxylate preferably comprises from 1 to 20 carbon atoms. The carboxylate is preferably a $C_{1-20}$ alkanoate. The silver carboxylate is preferably a silver salt of a $C_{1-20}$ alkanoic acid. Some non-limiting examples of silver carboxylates are silver formate, silver acetate, silver oxalate, silver propionate, silver butanoate, silver ethylhexanoate, silver neodecanoate, silver pentafluoropropionate, silver citrate, silver glycolate, silver lactate, silver benzoate, silver benzoate derivatives, silver trifluoroacetate, silver phenylacetate, silver phenylacetate derivatives, silver hexafluoroacetyl-acetonate, silver isobutyrylacetate, silver benzoylacetate, silver propionylacetate, silver acetoacetate, silver alpha-methylacetoacetate, silver alpha-ethylacetoacetate and any mixtures thereof. Silver oxalate is particularly preferred. One or more than one silver carboxylate may be in the ink. The silver carboxylate is preferably dispersed in the ink. Preferably, the ink does not contain flakes of silver-containing material.

The silver carboxylate may be present in the ink in any suitable amount, preferably in a range of about 5 wt % to about 75 wt %, based on total weight of the ink. More preferably, the amount is in a range of about 5 wt % to about 60 wt %, or about 5 wt % to about 50 wt %, or about 10 wt % to about 75 wt %, or about 10 wt % to about 60 wt %, or about 10 wt % to about 45 wt %, or about 25 wt % to about 40 wt %. In one especially preferred embodiment, the amount is in a range of about 30 wt % to about 35 wt %. In terms of silver content, silver itself is preferably present in a range of about 3 wt % to about 30 wt % based on total weight of the ink. More preferably, the amount is in a range of about 6 wt % to about 30 wt %, or about 15 wt % to about 25 wt %. In one especially preferred embodiment, the amount is in a range of about 18 wt % to about 24 wt %.

Organic amine compounds may be aliphatic and/or aromatic amines, for example $C_{1-20}$ alkyl amines and/or $C_{6-20}$ aryl amines. The organic amine compound may be substituted with one or more other functional groups, preferably polar functional groups. Some non-limiting examples of other functional groups include —OH, —SH, =O, —CHO, —COOH and halogen (e.g. F, Cl, Br). Preferably, the other functional group is —OH. A particularly preferred class of organic amine compounds is the amino alcohols, especially hydroxyalkylamines. Hydroxyalkylamines preferably comprise from 2 to 8 carbon atoms. Some non-limiting examples of hydroxyalkylamines are 1,2-ethanolamine, amino-2-propanol, 1,3-propanolamine, 1,4-butanolamine, 2-(butylamino)ethanol, 2-amino-1-butanol, and the like. Amino-2-propanol is particularly preferred. One or more than one organic amine compound may be in the ink.

The organic amine may be present in the ink in any suitable amount, preferably in a range of about 10 wt % to about 75 wt %, based on total weight of the ink. More preferably, the amount is in a range of about 20 wt % to about 60 wt %, or about 25 wt % to about 55 wt %. In one especially preferred embodiment, the amount is in a range of about 40 wt % to about 50 wt %.

The silver carboxylate and organic amine compound may form a complex in the ink. The complex may comprise a molar ratio of silver carboxylate to organic amine compound of 1:1 to 1:4, for example 1:1 or 1:2 or 1:3 or 1:4. Complexes of and interactions between the silver carboxylate and organic amine may provide silver metal precursors that may be formulated with other components as a molecular ink.

The organic polymer binder may be any suitable polymer, preferably a thermoplastic or elastomeric polymer. The organic polymer binder is preferably compatible with the organic amine compound, whereby a mixture of the organic amine compound in the organic polymer binder does not lead to significant phase separation. Some non-limiting examples are cellulosic polymers, polyacrylates, polystyrenes, polyolefins, polyvinyl acetals, polyesters, polyimides, polyols, polyurethanes, fluoropolymers, fluoroelastomers and mixtures thereof. The organic polymer binder may be homopolymeric or copolymeric. Cellulosic polymers are particularly preferred, for example, methylcellulose, ethylcellulose, ethyl methyl cellulose, hydroxyethyl cellulose, hydroxypropyl cellulose, hydroxyethyl methyl cellulose, hydroxypropyl methyl cellulose, ethyl hydroxyethyl cellulose, carboxymethyl cellulose or a mixture thereof. Hydroxyethyl cellulose is particularly preferred.

The organic polymer binder may be present in the ink in any suitable amount, preferably in a range of about 0.05 wt % to about 10 wt %, based on total weight of the ink. More preferably, the amount is in a range of about 0.1 wt % to about 5 wt %, or about 0.2 wt % to about 2 wt %, or about 0.2 wt % to about 1 wt %. In one especially preferred embodiment, the amount is in a range of about 0.3 wt % to about 0.95 wt %.

The surface tension modifier may be any suitable additive that improves flow and leveling properties of the ink. Some non-limiting examples are surfactants (e.g. cationic, non-ionic or anionic surfactants), alcohols (e.g. propanol), glycolic acid, lactic acid and mixtures thereof. Lactic acid is particularly preferred. Without the surface tension modifier, shape retention of traces produced from the ink may be poor, particularly in humid environments, resulting in nonuniform features.

The surface tension modifier may be present in the ink in any suitable amount, preferably in a range of about 0.1 wt % to about 5 wt %, based on total weight of the ink. More preferably, the amount is in a range of about 0.5 wt % to about 4 wt %, or about 0.8 wt % to about 3 wt %. In one especially preferred embodiment, the amount is in a range of about 1 wt % to about 2.7 wt %.

The solvent may be an aqueous or an organic solvent. Organic solvents or mixtures of organic solvents are preferred. In some instances, a mixture of one or more organic solvents with an aqueous solvent may be utilized. The solvent is preferably compatible with one or both of the organic amine compound or organic polymer binder. The solvent is preferably compatible with both the organic amine compound and the organic polymer binder. The organic amine compound and/or organic polymer binder are preferably dispersible, for example soluble, in the solvent. The organic solvent may be aromatic, non-aromatic or a mixture of aromatic and non-aromatic solvents. Aromatic solvents include, for example, benzene, toluene, ethylbenzene, xylenes, chlorobenzene, benzyl ether, anisole, benzonitrile, pyridine, diethylbenzene, propylbenzene, cumene, isobutylbenzene, p-cymene, tetralin, trimethylbenzenes (e.g. mesitylene), durene, p-cumene or any mixture thereof. Non-aromatic solvents include, for example, terpenes, glycol ethers (e.g. dipropylene glycol methyl ether, methylcarbitol, ethylcarbitol, butylcarbitol, triethyleneglycol and derivatives thereof), alcohols (e.g. methylcyclohexanols, octanols, heptanols, isopropanol) or any mixture thereof. Dipropylene glycol methyl ether is preferred.

The solvent may be present in the ink in any suitable amount, preferably in a range of about 1 wt % to about 50 wt %, based on total weight of the ink. More preferably, the amount is in a range of about 2 wt % to about 35 wt %, or about 5 wt % to about 25 wt %. In one especially preferred embodiment, the amount is in a range of about 10 wt % to about 20 wt %. The solvent generally makes up the balance of the ink.

The ink may also comprise a defoaming agent. The defoaming agent may be any suitable anti-foaming additive. Some non-limiting examples are fluorosilicones, mineral oils, vegetable oils, polysiloxanes, ester waxes, fatty alcohols, glycerol, stearates, silicones, polypropylene based polyethers and mixtures thereof. Glycerol and polypropylene based polyethers are particularly preferred. In the absence of the defoaming agent, some printed traces may tend to retain air bubbles following printing, resulting in nonuniform traces.

The defoaming agent may be present in the ink in any suitable amount, preferably in a range of about 0.0001 wt % to about 1 wt %, based on total weight of the ink. More preferably, the amount is in a range of about 0.001 wt % to about 0.1 wt %, or about 0.002 wt % to about 0.05 wt %. In one especially preferred embodiment, the amount is in a range of about 0.005 wt % to about 0.01 wt %.

The ink may also comprise a thixotropy modifying agent. The thixotropy modifying agent may be any suitable thixotropy-modifying additive. Some non-limiting examples are polyhydroxycarboxylic acid amides, polyurethanes, acrylic polymers, latex, polyvinylalcohol, styrene/butadiene, clay, clay derivatives, sulfonates, guar, xanthan, cellulose, locust gum, acacia gum, saccharides, saccharide derivatives, cassein, collagen, modified castor oils, organosilicones and mixtures thereof.

The thixotropy modifying agent may be present in the ink in any suitable amount, preferably in a range of about 0.05 wt % to about 1 wt %, based on total weight of the ink. More preferably, the amount is in a range of about 0.1 wt % to about 0.8 wt %. In one especially preferred embodiment, the amount is in a range of about 0.2 wt % to about 0.5 wt %.

The relative amounts and/or specific compositions of the various components of the ink may have an important role in optimizing performance of the ink. Preferred embodiments of the amounts and compositions of the components permit tuning the sintering temperature of the ink to accommodate shapeable substrates that are less robust to high temperatures, while maintaining high conductivity of conductive traces formed from the ink.

The ink may be deposited on a substrate by any suitable method to form a non-conductive trace of the ink on the substrate. The ink is particularly suited for printing, for example, screen printing, inkjet printing, flexography printing, gravure printing, off-set printing, airbrushing, aerosol printing, typesetting, stamp or any other method. Screen printing is especially preferred.

After deposition on the substrate, drying and decomposing the silver salt within the non-conductive trace forms a conductive trace. Drying and decomposition may be accomplished by any suitable technique, where the techniques and conditions are guided by the type of substrate on which the traces are deposited and the type of silver salt in the ink. For example, drying the ink and decomposing the silver salt may be accomplished by heating and/or photonic sintering with intense pulsed UV light.

In one technique, heating the substrate dries and sinters the trace to form the conductive trace. Sintering decomposes the silver salt to form conductive particles (for example nanoparticles) of the silver. It is an advantage that heating may be performed at a relatively low temperature range of about 80-140° C., especially about 85-140° C., more especially about 90-130° C., while producing relatively thin and highly conductive silver traces. While the ability to sinter at lower temperature is an advantage of the ink, heating may be performed at higher temperatures, if desired, for example at temperatures of 150° C. or higher or up to a temperature of about 250° C.

Heating is preferably performed for a time of about 1 hour or less, more preferably about 30 minutes or less, for example a time in a range of about 1-30 minutes, or about 2-20 minutes, in particular about 5-20 minutes. Heating is performed at a sufficient balance between temperature and time to sinter the trace on the substrate to form a conductive trace. For example, narrow, highly conductive traces may be formed by sintering at 120° C. for as little as 5 minutes or at 90° C. for 20-40 minutes. The type of heating apparatus also factors into the temperature and time required for sintering. Sintering may be performed with the substrate under an oxidizing atmosphere (e.g. air) or an inert atmosphere (e.g. nitrogen and/or argon gas), although an ambient atmosphere is preferred.

In another technique, a photonic sintering system may feature a high intensity lamp (e.g. a pulsed xenon lamp) that delivers a broadband spectrum of light. The lamp may deliver about 5-20 J/cm$^2$ in energy to the traces. Pulse widths are preferably in a range of about 0.58-1.5 ms. Photonic sintering may be performed under ambient conditions (e.g. in air). Photonic sintering is especially suited for polyethylene terephthalate, polycarbonate and polyimide substrates.

In yet other techniques, sintering may be performed using microwave or near infrared (NIR) methods.

A conductive trace formed by drying and sintering the ink on the substrate may be of any desired thickness and width. It is an advantage that the ink may be dried and sintered to form a conductive trace that is relatively thin and/or narrow, while maintaining relatively high conductivity (i.e. relatively low resistivity). In some embodiments, the conductive trace may have an average thickness of about 4 microns or less, or even about 1.5 microns or less, or even about 1 micron or less, for example about 0.3-1.5 microns or about 0.4-1 micron. In some embodiments, the conductive trace may have a nominal line width of about 30 mil or lower, or even about 20 mil or lower, for example about 2-20 mil. Sheet resistivity values may be less than about 30 mΩ/☐/mil, or even about 20 mΩ/☐/mil or less, for example about 5-20 mΩ/☐/mil. Additionally, the ink can provide conductive traces on a substrate with relatively low linewidth-over-spacing (L/S) values, which advantageously lends itself to miniaturization of electronic circuitry. For example, the L/S value may be less than about 100/70 μm, even as low as about 42/38 μm.

The substrate may be any suitable surface, especially printable surface. Surfaces may include, for example polyethylene terephthalate (PET) (e.g. Melinex™), amorphous polyethylene terephthalate (APET), glycol modified polyethylene terephthalate (PET-G), polyethylene naphthalate, polyolefin (e.g. silica-filled polyolefin (Teslin™)), polydimethylsiloxane (PDMS), polystyrene, polycarbonate, polyimide (e.g. Kapton™), thermoplastic polyurethane (TPU), acrylonitrile/butadiene/styrene, polystyrene, silicone membranes, wool, silk, cotton, flax, jute, modal, bamboo, nylon, polyester, acrylic, aramid, spandex, polylactide, latex, textiles (e.g. cellulosic textiles and threads/yarns), paper, glass, metal, dielectric coatings, among others.

The yarn or thread may be made out of any suitable material. Some non-limiting examples are untreated cotton, nylon, polyester, latex, silk, wool, fleece, linen, rayon, acrylic, bamboo, spandex, among others.

Shapeable substrates are preferred. Because the ink can be dried and sintered at temperatures under 100° C. to form conductive traces, the ink is compatible with the range of shapeable substrates currently commercially available. Shapeable substrates may be flexible (e.g. bendable, stretchable, twistable etc.) under particular forming conditions. In some instances, the shapeable substrate may retain the shaped form after forming, while in other instances, external force may be required to retain the shaped substrate in the shaped form. The shapeable substrate may be formed into the shaped substrate in any suitable manner, for example thermoforming, cold forming, extrusion, blow molding, etc.

Where the shapeable substrate is stretchable, the conductive silver traces can be stretched up to strains of at least about 1.2, or at least about 0.8, while remaining conductive. For example, the conductive silver traces can be stretched to strains from about 0.1 to at least about 1.2 while remaining conductive. The strain limit to which the conductive silver traces can be stretched while remaining conductive is at least partially dependent on the substrate.

The ink advantageously provides for a unique process for producing conductive silver traces on a shaped substrate. The ink may be deposited on a shapeable substrate and then dried to form a non-conductive trace containing the silver carboxylate on the shapeable substrate. The shapeable substrate may then be formed into a desired shape to produce a shaped substrate so that at least a portion of the non-conductive trace is situated on a shaped portion of the shaped substrate. Then, sintering the shaped substrate to decompose the silver carboxylate to metallic silver produces a conductive silver trace on at least the shaped portion of the shaped substrate. In this process, when the substrate is shaped, the traces are non-conductive and contain the silver carboxylate or silver carboxylate/organic amine complex dispersed in an organic polymer binder matrix. When the substrate is formed into the desired shape, for example by thermoforming, the silver carboxylate or silver carboxylate/organic amine complex deforms along with the organic polymer binder matrix without producing cracks in the trace. When the traces are sintered after shaping the substrate, the resulting conductive silver network is formed without or with fewer cracks, thereby maintaining high conductivity.

In contrast, prior methods of producing conductive silver traces on shaped substrates involve printing a silver-based ink on the substrate, curing the ink to dry and sinter the ink on the substrate thereby producing the conductive silver traces on the substrate, followed by forming the substrate into a desired shape. When the ink is cured, the conductive network is already established before the substrate is shaped. Therefore, as the forming process is undertaken, the silver particles (e.g. flakes or nanoparticles) in the trace separate (e.g. are pulled apart by the change in shape of the substrate) causing cracks to form in the traces thereby decreasing conductivity. This could be due to a change in thickness of the traces, which accompanies forming the substrate into the desired shape. Stretched traces become longer, narrower and thinner. Flake-based traces typically become less mechanically robust to flexing and creasing and less conductive when they are less than 10 μm thick. In contrast, the molecular inks of the present invention remain mechanically robust following flexing and creasing and highly conductive despite the fact that they are very thin (e.g. under 1 μm).

It is also possible to deposit the ink onto a shapeable substrate, dry the ink and then convert the ink into a conductive silver trace, for example by using heat. The shapeable substrate may then be formed into a desired shape to produce a shaped substrate so that at least a portion of the conductive trace is situated on a shaped portion of the shaped substrate. When the substrate is shaped, the silver traces remain conductive.

The deposited conductive trace on the substrate may be incorporated into an electronic device, for example electrical circuits, conductive bus bars (e.g. for photovoltaic cells), sensors (e.g. touch sensors, wearable sensors), antennae (e.g. RFID antennae), thin film transistors, diodes, smart packaging (e.g. smart drug packaging), conformable inserts in equipment and/or vehicles, and multilayer circuits and MIM devices including low pass filters, frequency selective surfaces, transistors and antenna on conformable surfaces that can withstand high temperatures. The ink enables miniaturization of such electronic devices.

EXAMPLES

Example 1

Molecular Ink Formulation

Molecular inks that can be processed at low temperature were formulated in accordance with the compositions shown in Tables 1-6. A molecular ink that can be processed at low temperature with improved and more reliable printability (i.e. dewetting and line uniformity improvements) was formulated in accordance with the composition shown in Table 4.

The ink is preferably used shortly after formulation, but may be stored for longer periods of time at a temperature in a range of about −4° C. to about 4° C. without significant decomposition. In addition, the ink can be recovered from the screen and reused for further printing provided it is stored in above mentioned temperature range.

TABLE 1

The composition of screen printable molecular ink NRC-848A3a

| Component | Purpose of addition | % by weight |
|---|---|---|
| Silver oxalate | Silver precursor | 32.6 |
| Amino-2-propanol | Amine | 45.5 |
| Hydroxyethyl cellulose | Binder/rheology modifier | 0.6 |
| Glycolic acid | Surface tension modifier | 1.9 |
| Glycerol | Defoaming agent | 2.6 |
| Dipropylene glycol methyl ether | Solvent | 16.8 |

TABLE 2

The composition of screen printable molecular ink NRC-849A1

| Component | Purpose of addition | % by weight |
|---|---|---|
| Silver oxalate | Silver precursor | 33.1 |
| Amino-2-propanol | Amine | 46.5 |
| Hydroxyethyl cellulose | Binder/rheology modifier | 0.63 |
| Lactic acid | Surface tension modifier | 2.45 |
| Dipropylene glycol methyl ether | Solvent | 17.3 |

TABLE 3

The composition of screen printable molecular ink NRC-850A

| Component | Purpose of addition | % by weight |
|---|---|---|
| Silver oxalate | Silver precursor | 33.1 |
| Amino-2-propanol | Amine | 46.5 |
| Hydroxyethyl cellulose | Binder/rheology modifier | 0.63 |
| Lactic acid | Surface tension modifier | 2.47 |
| Antifoam 204 | Defoaming agent | 0.00073 |
| Dipropylene glycol methyl ether | Solvent | 17.4 |

TABLE 4

The composition of screen printable molecular ink NRC-850A1

| Component | Purpose of addition | % by weight |
|---|---|---|
| Silver oxalate | Silver precursor | 33.1 |
| Amino-2-propanol | Amine | 46.5 |
| Hydroxyethyl cellulose | Binder/rheology modifier | 0.63 |
| Lactic acid | Surface tension modifier | 2.48 |
| Antifoam 204 | Defoaming agent | 0.00073 |
| Dipropylene glycol methyl ether | Solvent | 16.9 |
| Polyhydroxycarboxylic acid amide (BYK™-R 605) | Thixotropy modifying agent | 0.29 |

TABLE 5

The composition of screen printable molecular ink NRC-850A2

| Component | Purpose of addition | % by weight |
|---|---|---|
| Silver oxalate | Silver precursor | 33.0 |
| Amino-2-propanol | Amine | 46.4 |
| Hydroxyethyl cellulose | Binder/rheology modifier | 0.92 |
| Lactic acid | Surface tension modifier | 2.47 |
| Antifoam 204 | Defoaming agent | 0.00073 |
| Dipropylene glycol methyl ether | Solvent | 16.9 |
| Polyhydroxycarboxylic acid amide (BYK™-R 605) | Thixotropy modifying agent | 0.38 |

TABLE 6

The composition of screen printable molecular ink NRC-850A3

| Component | Purpose of addition | % by weight |
|---|---|---|
| Silver oxalate | Silver precursor | 32.6 |
| Amino-2-propanol | Amine | 46.0 |
| Hydroxyethyl cellulose | Binder/rheology modifier | 0.92 |
| Rokrapol 7075 | Binder | 0.35 |
| Lactic acid | Surface tension modifier | 2.57 |
| Antifoam 204 | Defoaming agent | 0.00073 |
| Dipropylene glycol methyl ether | Solvent | 17.1 |
| Polyhydroxycarboxylic acid amide (BYK™-R 605) | Thixotropy modifying agent | 0.46 |

TABLE 7

The composition of screen printable molecular ink NRC-850A4

| Component | Purpose of addition | % by weight |
|---|---|---|
| Silver oxalate | Silver precursor | 34.3 |
| Amino-2-propanol | Amine | 38.5 |
| 2-amino-1-butanol | Amine | 14.4 |
| Hydroxyethyl cellulose | Binder/rheology modifier | 0.7 |
| Lactic acid | Surface tension modifier | 0.9 |
| Antifoam 204 | Defoaming agent | 0.0076 |
| Dipropylene glycol methyl ether | Solvent | 6.9 |
| isopropanol | Solvent | 4 |
| Polyhydroxycarboxylic acid amide (BYK™-R 605) | Thixotropy modifying agent | 0.3 |

Example 2

Screen Printing the Low Temperature Inks to Produce Sub-100 μm Traces

Figure 1B:
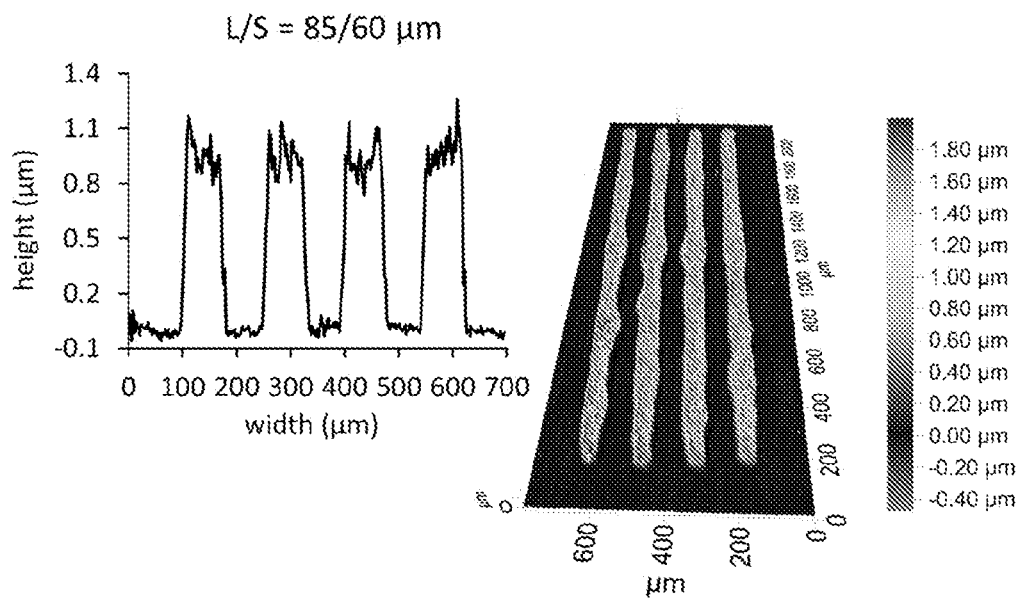
FIG. 1B depicts another three dimensional profilometer image of printed and sintered traces produced from the low temperature molecular ink (NRC-848A3a), and the resulting cross section that further highlights linewidth and line spacing (L/S) that can be achieved with the ink.

On a sheet of Melinex™ ST505, the ink NRC-848A3a was screen printed (stainless steel, mesh count/inch=400; emulsion thickness=22.5 μm) and thermally processed at 75° C. for 6 minutes and 120° C. for 20 minutes to produce several series of four parallel conductive silver traces having line widths of about 42 μm and line spacing of about 38 μm on the substrate, as shown in FIG. 1A and line widths of about 85 μm and line spacing of about 60 μm, as shown in FIG. 1B. The pitch, defined as linewidth and line spacing (L/S), was measured to be 42/38, and 85/65 μm, respectively. 3-D profilometer images of the traces and the corresponding cross-sections measured by optical profilometry are provided in FIG. 1A and FIG. 1B.

Example 3

Figure 2A:
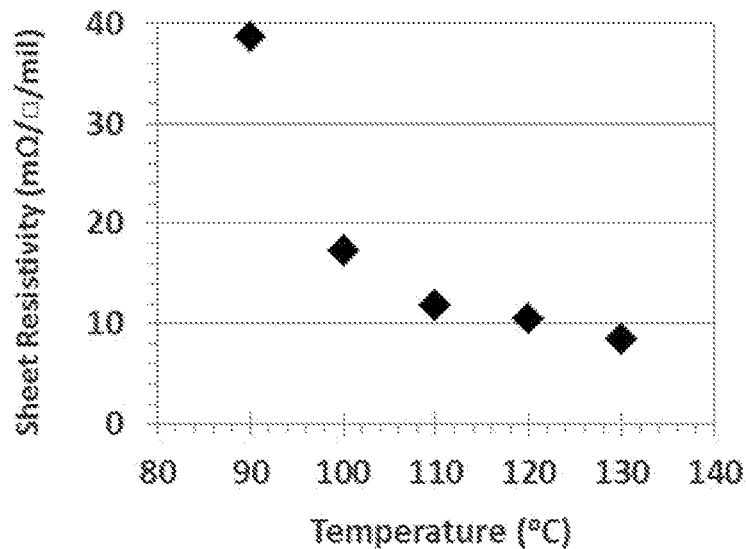
FIG. 2A depicts a graph of sheet resistivity (mΩ/□/mil) vs. temperature (° C.) for conductive silver traces having linewidths of about 512 μm produced from another ink of the present invention (NRC-849A1) processed at different temperatures.
Figure 2B:
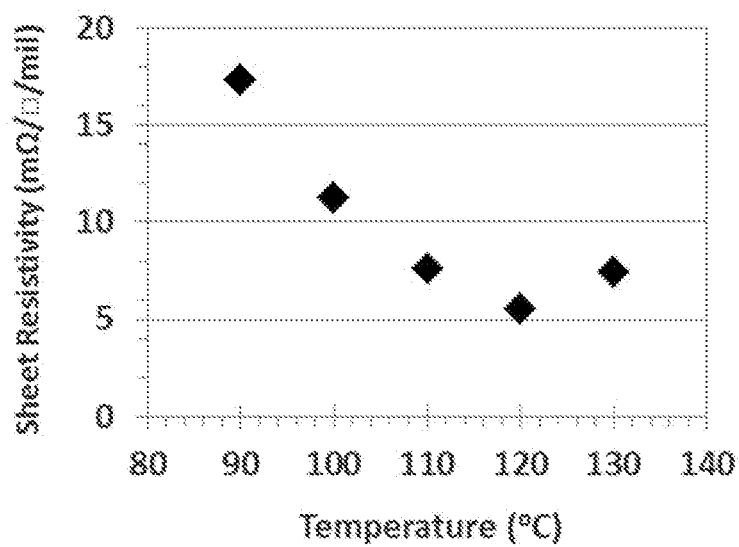
FIG. 2B depicts a graph of sheet resistivity (mΩ/□/mil) vs. temperature (° C.) for conductive silver traces having linewidths of about 444 μm produced from another ink of the present invention (NRC-850A) processed at different temperatures.

Electrical Properties of the Low Temperature Ink Processed at Temperatures Compatible with Low Glass Transition Temperature Substrates Two inks (NRC-849A1 and NRC-850A) were screen printed on five separate samples of Melinex® ST505 substrate in a manner as described in Example 2. The traces on each substrate were thermally processed for 20 minutes at five different temperatures (91° C., 102° C., 111° C., 121° C. and 131° C.) to form conductive silver traces on each substrate. The sheet resistivity values for the conductive silver traces produced from NRC-849A1 and NRC-850A were calculated and the results are shown in FIG. 2A and FIG. 2B, respectively. The results indicate that sheet resistivity values of less than about 40 mΩ/☐/mil are obtainable at thermal processing temperatures as low as about 90° C. That the ink may be thermally processed at temperatures as low as about 90° C. while maintaining good to excellent electrical properties is conducive for using the ink to produce conductive silver traces on thermoformable substrates. Conductive traces can be produced at temperatures as low as 81° C. as well, though the sheet resistivity values are quite high (about 650 mΩ/☐/mil).

As seen in Table 8, the ink (NRC-850A) may be screen printed and thermally processed at 120° C. to produce conductive silver traces having measured line widths as low as 2.8 mil (71 μm) and line thicknesses of about 0.9 μm or less, while maintaining sheet resistivity of less than about 20 mΩ/☐/mil. Of particular note, the measured 5.5 mil (141 μm) to 18.9 mil (408 μm) traces have sheet resistivity values of about 10 mΩ/☐/mil.

TABLE 8

The measured linewidths, trace thickness and resulting sheet resistivities
measured for 10 cm long lines printed from NRC-850A on Melinex ® ST505 and sintered
at 75° C. for 5 minutes followed by 120° C. for 20 minutes.

| | nominal line width | | | | | |
|---|---|---|---|---|---|---|
| | 2 mil | 3 mil | 5 mil | 10 mil | 15 mil | 20 mil |
| measured linewidth (μm) | 71 ± 3 | 99 ± 4 | 141 ± 3 | 250 ± 6 | 364 ± 3 | 480 ± 3 |
| thickness (μm) | 0.75 ± 0.05 | 0.57 ± 0.01 | 0.58 ± 0.01 | 0.84 ± 0.08 | 0.86 ± 0.08 | 0.79 ± 0.10 |
| sheet resistivity (mΩ/□/mil) | 30.0 ± 0.2 | 13.1 ± 1.0 | 8.5 ± 0.2 | 10.2 ± 0.2 | 10.1 ± 0.3 | 9.2 ± 1.3 |

Example 4

Printability of Ink in High Humidity Environments

Figure 3:
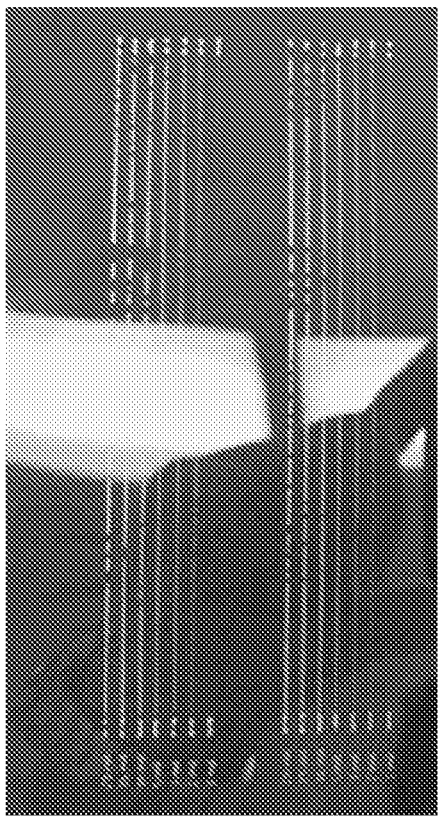
FIG. 3 depicts a screen-printed trace produced from ink NRC-849A1 that has been thermally sintered at 120° C. for 5 minutes, demonstrating the effect on trace shape when a thixotropic agent is not included in the ink and the ink is printed in high (>50%) humidity.
Figure 4:
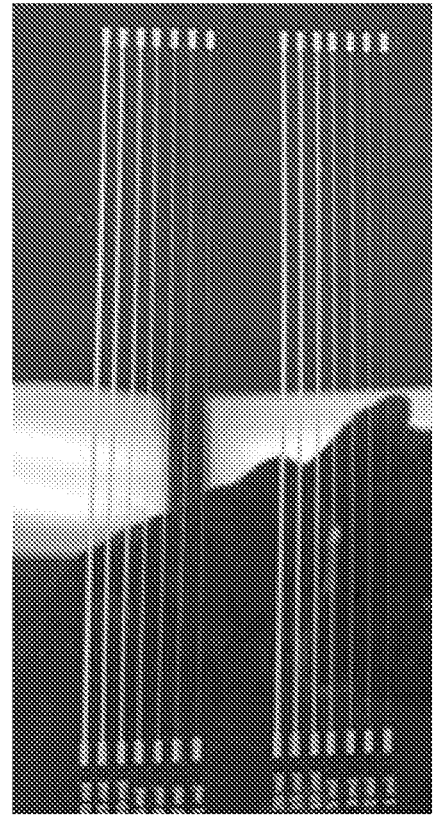
FIG. 4 depicts a screen-printed trace produced from ink NRC-850A1 that has been thermally sintered at 120° C. for 5 minutes, demonstrating the effect on trace shape when a thixotropic agent is included in the ink and the ink is printed in high (>50%) humidity.

The inks NRC-849A1 and NRC-850A1 were screen printed on Melinex™ ST505 substrate in a manner as described in Example 2 in high humidity environments (humidity >50%). The traces on each substrate were thermally processed for 20 minutes at 121° C. to form conductive silver traces (FIG. 3 and FIG. 4, respectively). In the absence of a thixotropic agent (NRC-849A1, FIG. 3) the ink significantly dewets from the surface, producing nonuniform and broken traces. In contrast, with the addition of the thixotropic agent (NRC-850A1, FIG. 4) the traces do not dewet from the substrate surface and remain uniform.

Example 5

Cold Storage without Ink Solidification

The formulation containing both amino-2-propanol and 2-amino-1-butanol (NRC-850A4) enables storage at −10 to −4° C. without ink solidification while maintaining electrical properties similar to that for NRC-850A2 and NRC-850A3, which contain only amino-2-propanol. Note that, though NRC-850A2 and NRC-850A3 solidify during cold storage, warming to room temperature regenerates the liquid state of the ink over time.

Example 6

Thermoforming on PET-G Substrate—Forming then Sintering

Figure 5:
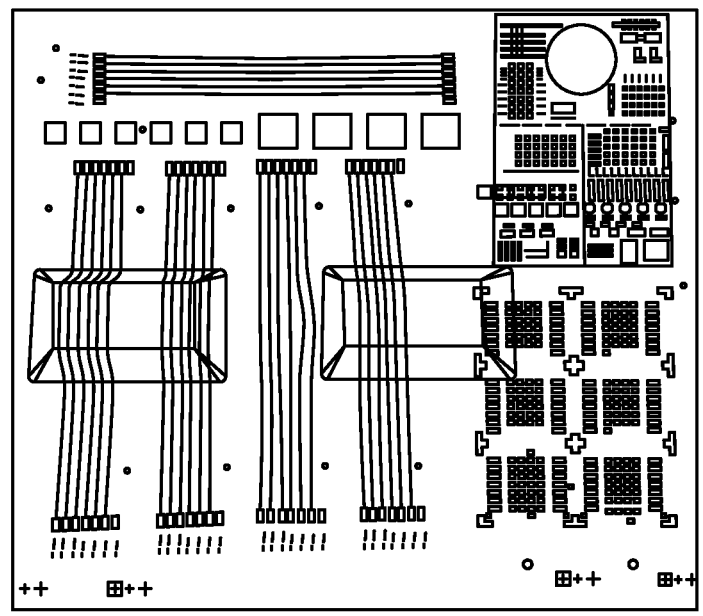
FIG. 5 depicts a top view of a trace of ink NRC-850A2, which has been printed on a glycol-modified polyethylene terephthalate (PET-G) substrate, dried at 75° C., thermoformed over trapezoidal shapes and photosintered with an energy of 15 J/cm² to convert the ink to a silver trace.

The ink NRC-850A2 was screen printed onto a sheet of polyethylene terephthalate glycol-modified (PET-G) (508 μm, 20 mil thick) via screen printing to produce a variety of 10 cm long traces with linewidths ranging from about 100 μm to about 590 μm. Following printing, the non-conductive traces were dried and thermoformed around a variety of shapes including trapezoid, half-cylinder and half-sphere features. The thermoformed traces can be subsequently photonically sintered (Xenon Sinteron 2000 system) to produce conductive traces. A representative photograph of thermoformed traces is provided in FIG. 5 and the corresponding resistance measured across the traces for the conductive features is provided in Table 9, demonstrating that continuous traces of silver metal are formed without cracking where the non-conductive ink underwent deformation during thermoforming, but prior to sintering. Table 9 highlights that the resistance measured across the control traces (i.e. those that were not thermoformed) are nearly identical to those that were thermoformed, suggesting that the electrical properties of the traces are unaffected by the thermoforming process. In some cases, the resistance measured across the thermoformed traces is actually lower than that of the control traces. This may be due to portions of the thermoformed traces being higher than the control samples, which brings those portions closer to the lamp and exposes it to more intense pulsed light.

TABLE 9

The change in resistance that accompanies the thermoforming
of 20 mil traces produced from NRC-850A2 that are printed,
dried, thermoformed and subsequently converted to conductive traces
using pulsed light with energies of 15 and 20 J/cm². In
each case, the control line was exposed to the same process
without being thermoformed.

| Energy (J/cm²) | Linewidth (mil) | Shape of object thermoformed into trace | Resistance across trace (Ω) |
|---|---|---|---|
| 20 | 23 | Control (no shape) | 70 |
| | 23 | 35° trapezoid | 69 |
| | 23 | 35° trapezoid | 60 |
| | 23 | 35° trapezoid | 56 |
| 15 | 23 | Control (no shape) | 69 |
| | 23 | 35° trapezoid | 60 |
| | 23 | 35° trapezoid | 59 |
| | 23 | 35° trapezoid | 68 |

Example 7

Thermoforming on PET-G Substrate—Sintering then Forming

Figure 6:
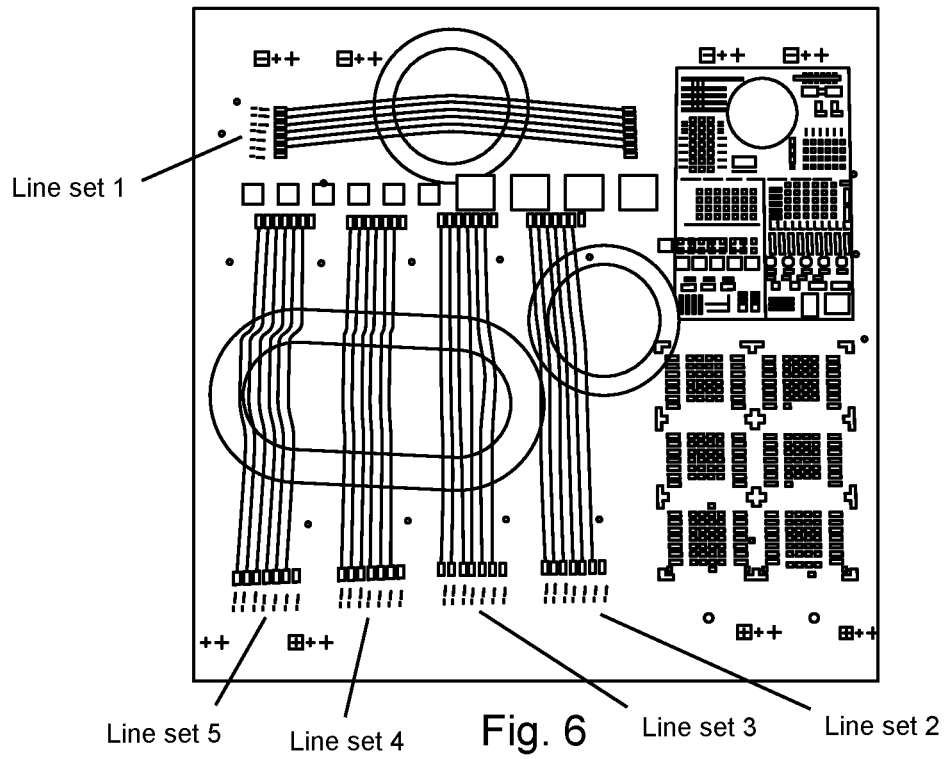
FIG. 6 depicts a top view of a trace of ink NRC-850A3, which has been printed on a glycol-modified polyethylene terephthalate (PET-G) substrate, dried at 75° C., sintered at 120° C. to convert the ink to a silver trace and subsequently thermoformed over dome and half cylinder shapes.

The ink NRC-850A3 was screen printed onto a sheet of PET-G to produce a variety of 10 cm long traces with measured linewidths ranging from about 100 μm to about 550 μm. Following printing, the traces were thermally sintered at 75° C. for 6 minutes and 125° C. for 15 minutes to produce a series of conductive traces. The traces were subsequently thermoformed around a variety of shapes including half-cylinders and domes. A representative thermoformed trace is provided in FIG. 6 and the corresponding resistance of the thermoformed traces in comparison to control traces are provided in Table 10. Though the resistance of the traces do increase (between 1.6 and 4.5 fold depending on the amount of elongation) following thermoforming, the thermoformed traces produced from the molecular ink remain conductive.

TABLE 10

The change in resistance that accompanies the thermoforming of half-cylinder and dome shapes into molecular ink traces printed from NRC-850A3 on PET-G and thermally sintered at 125° C. for 15 minutes. In each case, the average stretch the trace is subjected to is also included.

| | | nominal linewidth (mil) | | |
|---|---|---|---|---|
| | | 20 | 15 | 10 |
| Line set 5 | resistance before thermoforming (Ω) | 158 | 183 | 225 |
| | resistance after thermoforming (Ω) | 561 | 660 | 758 |
| | average % stretch | 14 | 14 | 14 |
| Line set 4 | resistance before thermoforming (Ω) | 170 | 194 | 233 |
| | resistance after thermoforming (Ω) | 751 | 763 | 831 |
| | average % stretch | 13 | 13 | 13 |
| Line set 3 | resistance before thermoforming (Ω) | 180 | 200 | 237 |
| | resistance after thermoforming (Ω) | 699 | 665 | 676 |
| | average % stretch | 10 | 10 | 10 |
| Line set 2 | resistance before thermoforming (Ω) | 197 | 208 | 237 |
| | resistance after thermoforming (Ω) | 369 | 355 | 405 |
| | average % stretch | 8 | 8 | 8 |
| Line set 1 | resistance before thermoforming (Ω) | 155 | 182 | 249 |
| | resistance after thermoforming (Ω) | 346 | 345 | 390 |
| | average % stretch | 11 | 11 | 11 |

Example 8

Stretching Linear Conductive Traces Derived from Molecular Inks

Figure 7A:
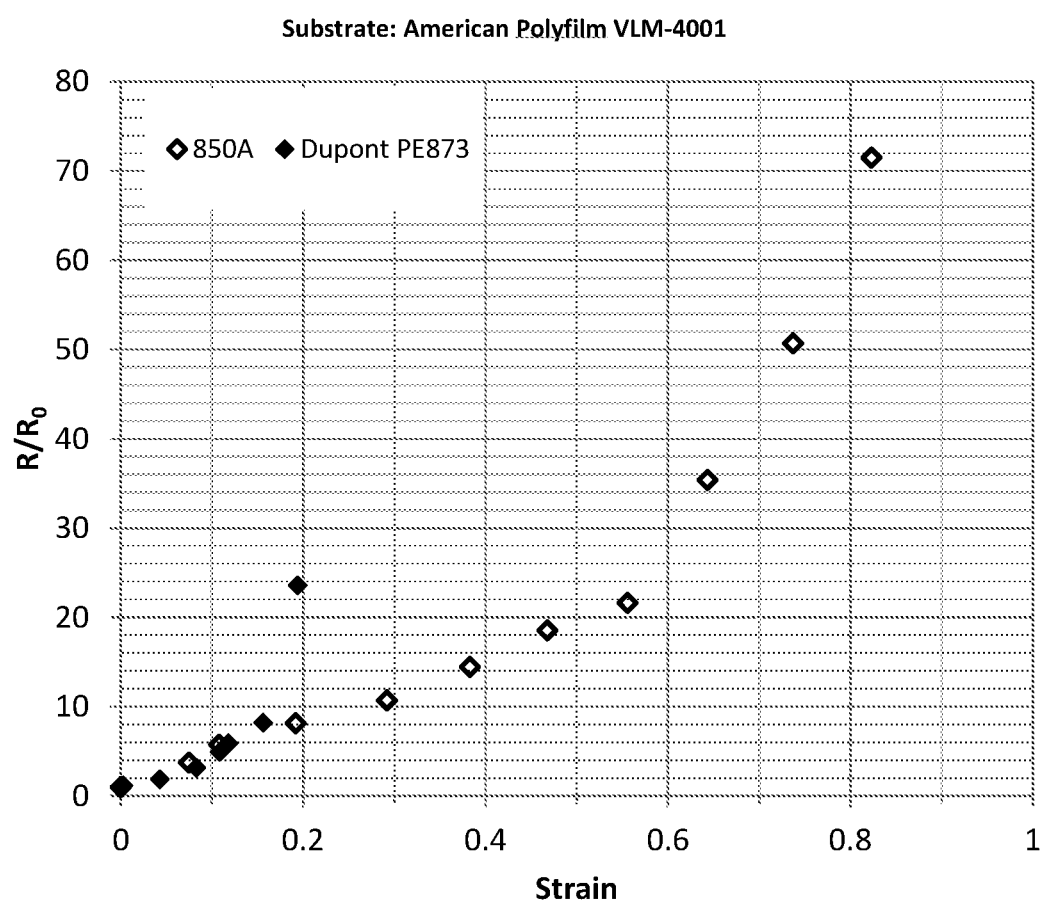
FIG. 7A depicts a normalized resistance of silver lines printed from ink NRC-850A and Dupont's PE873 ink as a function of applied strain, where the lines were printed on ozone treated polyester polyurethane (American Polyfilm VLM-4001).
Figure 7B:
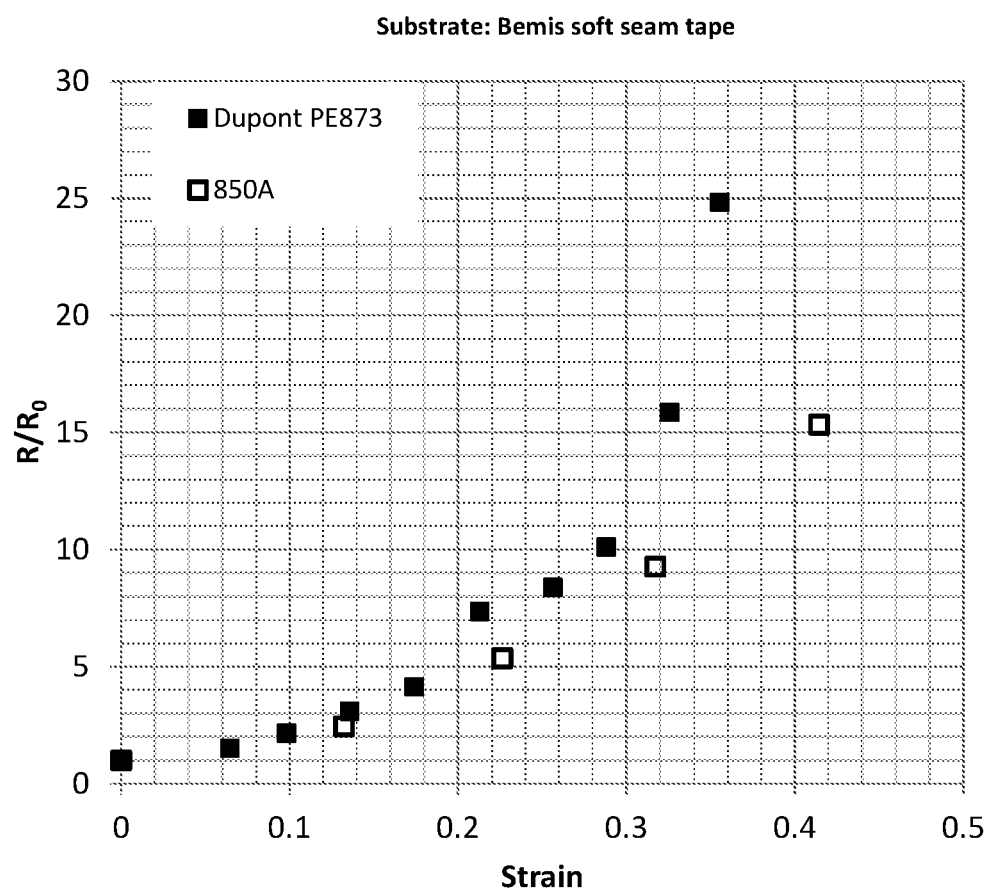
FIG. 7B depicts a normalized resistance of silver lines printed from ink NRC-850A and Dupont's PE873 ink as a function of applied strain, where the lines were printed on polyurethane soft seam tape (Bemis ST604).

The ink NRC-850A as well as commercially available ink Dupont PE873 (formulated for stretchable electronics) were screen printed onto two thermoplastic polyurethane substrates (Bemis soft seam tape ST604, and, American Polyfilm, Inc VLM-4001). The VLM-4001 polyurethane substrate was treated by reactive ozone prior to printing. The printed traces were linear, thermally sintered at 150° C. for 15 mins and were 20 mil wide and 4 cm long. A strain was applied to the samples and the changes in resistance were measured under strain. FIG. 7A shows the normalized resistance ($R/R_0$ where $R_0$ represents the resistance of the sample under zero strain) as a function of applied strain for the two inks on American Polyfilm VLM-4001. FIG. 7B shows the normalized resistance as a function of applied strain for the two inks on Bemis soft seam tape ST604. On both substrates, ink NRC-850A shows a lower normalized resistance as a function of applied strain than Dupont PE873. In addition, NRC-850A remains conductive under higher strain than the Dupont PE873 ink.

Example 9

Stretching Meandering Conductive Traces Derived from Molecular Inks

Figure 8A:
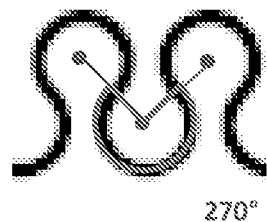
FIG. 8A depicts a serpentine pattern that was used to print the ink NRC-850A onto polyurethane.
Figure 8B:
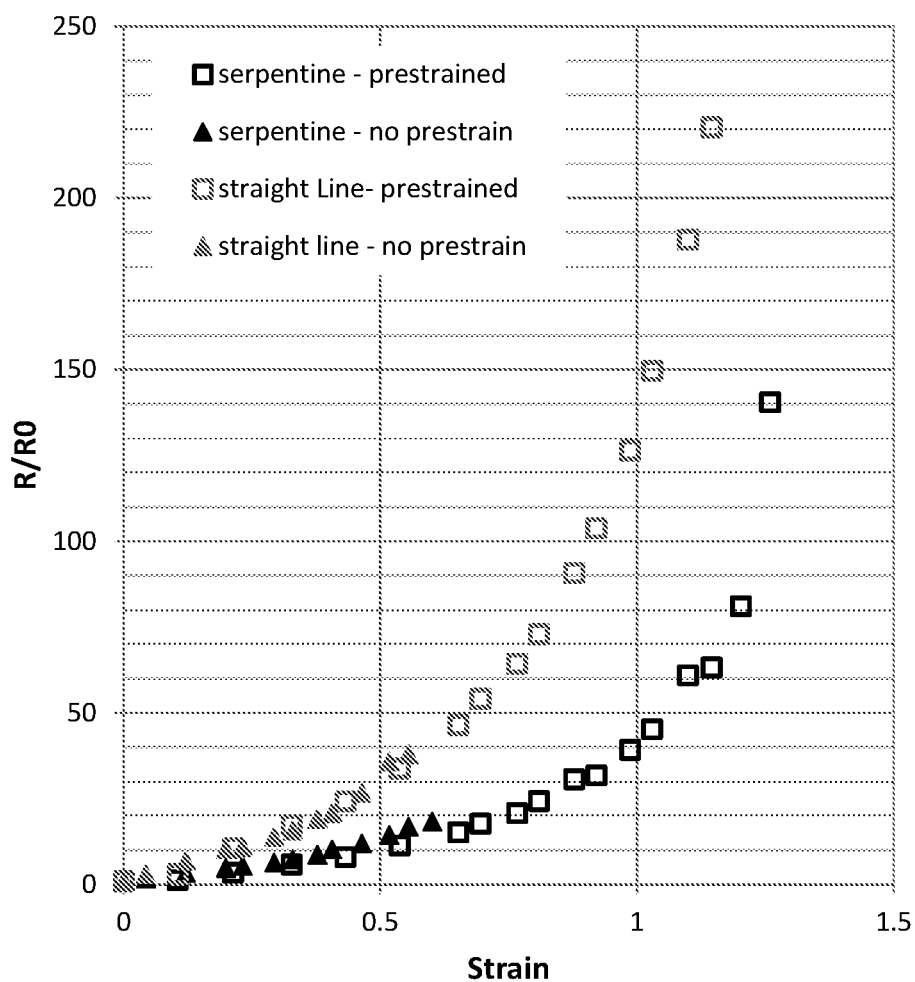
FIG. 8B depicts normalized resistance as a function of applied strain for silver lines printed using ink NRC-850A, where the lines were printed on ozone-treated polyester polyurethane (American Polyfilm VLM-4001). For the 'prestrained' sample, the polyurethane substrate was stretched by 10% in the direction of the line when the ink was deposited on the substrate.

In another example, the polyurethane substrate American Polyfilm VLM-4001 was ozone treated. The ink NRC-850A was printed on the polyurethane substrate under two conditions. In one case, the substrate was under no strain. In a second case, the substrate was pre-strained by 10% in one direction (i.e. the substrate was stretch by 10% during the time of printing). The print pattern included linear and serpentine traces of 20 mils in width and 4 cm in length between the electrical contact pads. FIG. 8A shows the serpentine lines made up of repeat units of a 270° of a circle. The normalized resistance of the linear and serpentine traces was measured as a function of applied strain, as shown in FIG. 8B. The silver serpentine traces printed on the pre-strained polyurethane remained conductive up to over 120% applied strain and the resistance at 120% strain was 150 times greater than the resistance under no strain. Table 11 compares the normalized resistance for all four conditions (serpentine traces, linear traces, pre-strained and no pre-strained) at 40% applied strain.

TABLE 11

The normalized resistance of the serpentine lines and straight line that were prepared under no pre-strain and 10% strain when printed. The normalized resistance is measured at 40% applied strain.

| | | $R/R_0$ at 40% strain |
|---|---|---|
| serpentine traces | no pre-strain | 20 |
| | pre-strained | 8 |
| linear traces | no pre-strain | 24 |
| | pre-strained | 21 |

Example 10

Development of Conductive Threads

Figure 9A:
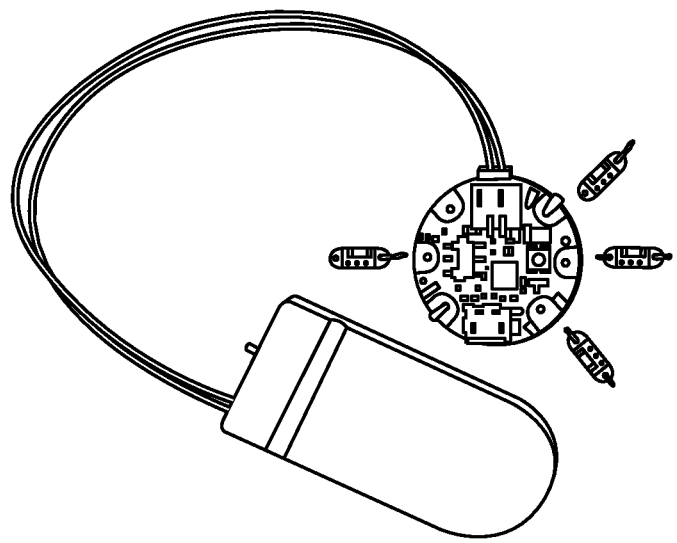
FIG. 9A depicts a photograph of functional LEDs that are being powered by conductive threads prepared with the molecular inks described in this application.
Figure 9B:
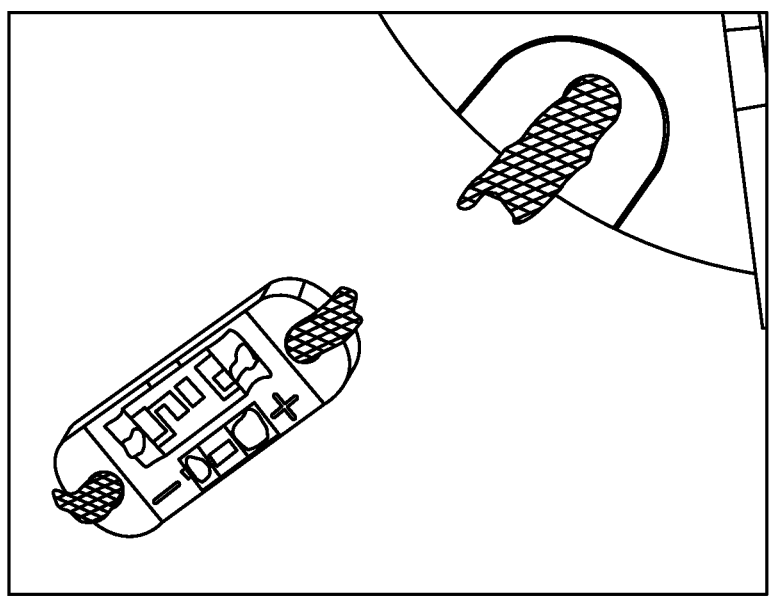
FIG. 9B depicts a close-up photograph of a single LED that is wired to the wearable platform using conductive thread sewn through the electrode on the platform and through the positive (+) electrode on the LED. Note the thread from the negative (−) electrode is going to the ground on the wearable device on the back side of the fabric.

To impart electrical properties to the threads, untreated cotton, nylon and polyester threads were soaked in the ink (NRC-850A3) for 1-60 minutes. Excess ink is removed from the threads by squeezing it between the thumb and finger and pulling it upwards. The resulting silver oxalate molecular ink soaked threads are subsequently secured into clips fastened to a metal frame, placed in an oven and heated at 120-150° C. for 20 minutes. The effectiveness of the coating progress in producing conductive threads was monitored by measuring the resistances of the threads (Table 12). In practical application, the threads can be used to incorporate LEDs (driven by the Adafruit Gemma wearable electronic platform) onto a swath of fabric. As demonstrated in FIGS. 9A and 9B, for each LED the power is supplied to the +ve end of the LED by a nylon thread. The cotton thread was used to attach the ground terminal to the −ve terminal of the upper left LED and polyester thread was used to attach the ground terminal to the −ve terminal of the lower right LED. This demonstrates that the modified conductive threads are robust and remain functional despite being pulled through the fabric and sewn around the eyelets of the LED and the Gemma wearable platform (FIGS. 9A and B).

TABLE 12

The Measured Resistance of a Polyester, Cotton and Nylon and Polyester Threads Following 3 cycles of Soaking in the Silver Oxalate Molecular Ink for 1 minute and Heating at 150° C. for 20 Minutes.

| Material | Resistance (Ω/cm) | Weight of unmodified thread (tex) | Weight of conductive thread (tex) |
|---|---|---|---|
| Polyester | 0.24 ± 0.05 | 30 | 87 ± 9 |
| Cotton | 0.67 ± 0.15 | 38 | 157 ± 6 |
| Nylon | 0.12 ± 0.04 | 80 | 137 ± 4 |

The novel features will become apparent to those of skill in the art upon examination of the description. It should be understood, however, that the scope of the claims should not be limited by the embodiments, but should be given the broadest interpretation consistent with the wording of the claims and the specification as a whole.

The invention claimed is:

1. A molecular ink comprising: 25 wt % to 40 wt % of a silver carboxylate comprising silver oxalate; 40 wt % to 50 wt % of an organic amine compound comprising amino-2-propanol; an organic polymer binder comprising 0.3 wt % to 0.95 wt % hydroxyethyl cellulose; a surface tension modifier comprising 1 wt % to 2.7 wt % of glycolic acid or lactic acid; and, a solvent comprising 10 wt % to 20 wt % of dipropylene glycol methyl ether, all weights based on total weight of the ink, wherein the ink is sinterable at a temperature of 130° C. or less to produce a conductive silver trace.

2. The ink according to claim 1, wherein the organic amine compound further comprises 2-amino-1-butanol.

3. The ink according to claim 1, further comprising a defoaming agent.

4. The ink according to claim 1, further comprising a thixotropy modifying agent.

5. A process for producing a conductive silver trace on a substrate, the process comprising the steps of depositing an ink as defined in claim 1 onto a substrate to form a non-conductive trace of the ink on the substrate, and sintering the non-conductive trace of the ink on the substrate at a temperature of 130° C. or less to form the conductive silver trace.

6. The process according to claim 5, wherein the substrate is a shapeable substrate and wherein the process further comprises the steps of:
    drying the ink on the shapeable substrate; and,
    forming the shapeable substrate into a shape before or after sintering the non-conductive trace to produce a shaped substrate so that at least a portion of the conductive silver trace post sintering is situated on a shaped portion of the shaped substrate.

7. The process according to claim 6, wherein the forming comprises thermoforming.

8. The process according to claim 5, wherein the substrate comprises polyethylene terephthalate (PET), amorphous polyethylene terephthalate (APET), glycol modified polyethylene terephthalate (PET-G)), polyolefin, polydimethylsiloxane (PDMS), polystyrene, polycarbonate, polyimide, thermoplastic polyurethane (TPU) or a silicone membrane.

9. The process according to claim 6, wherein the shapeable substrate is a stretchable substrate, and the conductive silver trace on the stretchable substrate remains conductive when stretched to strains from about 0.1 to at least about 1.2.

10. The process according to claim 5, wherein the sintering is performed by photonic sintering or by microwave or near infrared (NIR) methods.

11. The process according to claim 5, wherein the sintering is performed at a temperature in a range of 90° C. to 130° C.

12. The process according to claim 5, wherein the depositing comprises screen printing.

13. A process for producing a conductive silver thread/yarn, the process comprising: depositing an ink as defined in claim 1 onto a yarn or thread to form a non-conductive coated yarn or thread, and sintering the non-conductive yarn/thread at a temperature of 130° C. or less to form the conductive silver thread/yarn.

* * * * *